United States Patent
Calvanese Strinati

(10) Patent No.: US 8,645,805 B2
(45) Date of Patent: Feb. 4, 2014

(54) CONDITIONAL DECODING RECEIVER

(75) Inventor: Emilio Calvanese Strinati, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 1197 days.

(21) Appl. No.: 12/004,085

(22) Filed: Dec. 18, 2007

(65) Prior Publication Data

US 2009/0013235 A1    Jan. 8, 2009

(30) Foreign Application Priority Data

Dec. 18, 2006 (FR) ..................................... 06 55598

(51) Int. Cl.
*G06F 11/00* (2006.01)
*H03M 13/00* (2006.01)

(52) U.S. Cl.
USPC .......................................................... 714/780

(58) Field of Classification Search
None
See application file for complete search history.

(56) References Cited

U.S. PATENT DOCUMENTS

| | | | |
|---|---|---|---|
| 7,525,909 B2 * | 4/2009 | Fan et al. ...................... | 370/230 |
| 7,769,038 B2 * | 8/2010 | Hamilton et al. .............. | 370/429 |
| 2005/0149835 A1 * | 7/2005 | Dacosta ......................... | 714/794 |
| 2005/0174983 A1 * | 8/2005 | Naguleswaran et al. ...... | 370/347 |
| 2006/0083295 A1 * | 4/2006 | Ahmed et al. ................. | 375/222 |
| 2006/0233265 A1 * | 10/2006 | Rajan et al. ................... | 375/259 |
| 2006/0276217 A1 * | 12/2006 | Khojastepour et al. ........ | 455/522 |
| 2009/0269081 A1 * | 10/2009 | Cai et al. ....................... | 398/202 |

FOREIGN PATENT DOCUMENTS

| | | |
|---|---|---|
| EP | 1 128 589 | 8/2001 |
| WO | WO 02/39689 | 5/2002 |

OTHER PUBLICATIONS

Hagenauer, J. et al.: "Iterative Decoding of Binary Block and Convolutional Codes" published in IEEE Trans. on Information Theory, vol. 42, No. 2, Mar. 1996, pp. 429-445.

Malkamaki, E. et al.: "Evaluating the Performance of Convolutional Codes over Block Fading Channels" published in IEEE Trans. on Information Theory, vol. 45, No. 5, pp. 1643-1646, Jul. 1999.

Matache, A. et al.: Stopping Rules for Turbo Decoders, TMO Progress Report 42-142, Jet Propulsion Laboratory, pp. 1-22, Aug. 15, 2000.

Shao, R.Y., et al.: "Two Simple Stopping Criteria for Turbo Decoding", published in IEEE Transactions on Communications, vol. 47, pp. 117-120, Aug. 1999.

* cited by examiner

*Primary Examiner* — Daniel McMahon
(74) *Attorney, Agent, or Firm* — Nixon Peabody LLP

(57) ABSTRACT

A wireless telecommunication system receiver is described comprising a demodulator adapted to demodulate a signal received from a source via a transmission channel to provide an error correction code word in the form of flexible or hard values, a decoder adapted to decode the code word, characterized in that it further comprises decision means adapted to receive an estimation of the fading coefficients of the channel during the transmission of the code word as well as an estimation of the noise variance or the signal to noise ratio, to deduce therefrom an estimation of the relative instantaneous mutual information to the channel, and to decide whether or not to inhibit the decoding of the code word by the decoder, according to whether the binary rate of transmission of the source is respectively greater than or less than a characteristic threshold of the instantaneous mutual information.

10 Claims, 1 Drawing Sheet

FIG. 1
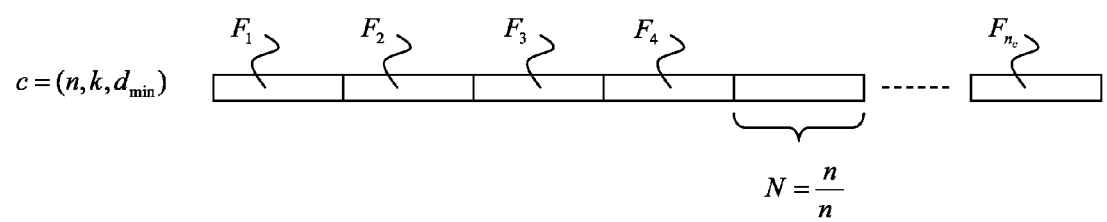
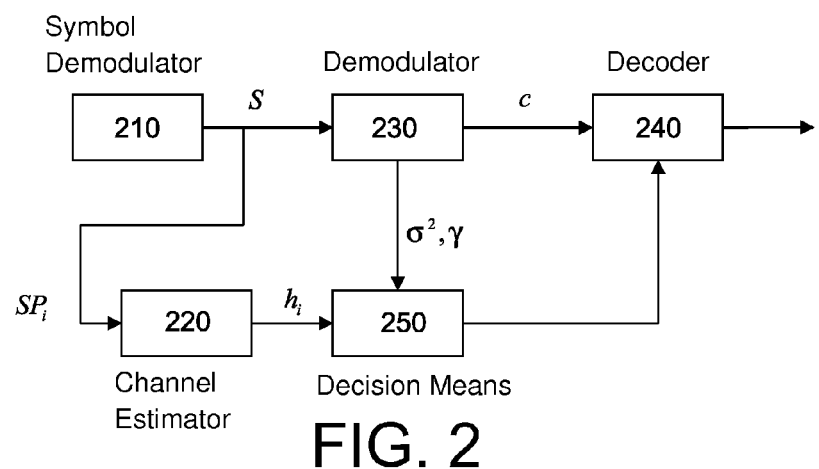
FIG. 2

CONDITIONAL DECODING RECEIVER

CROSS REFERENCE TO RELATED APPLICATIONS OR PRIORITY CLAIM

This application claims priority to French Patent Application No. 06 55598, filed Dec. 18, 2006.

TECHNICAL FIELD

This invention relates to the field of decoding and more particularly iterative decoding. It has applications especially in the receivers of wireless telecommunication systems.

STATE OF THE PRIOR ART

Iterative decoding algorithms are well known in the prior art, either in the context of turbo-decoding or, more generally, in the context of decoding by message-passing in a two part graph. For example, a detailed description of turbo-decoding algorithms can be found in the article of J. Hagenauer et al. entitled "Iterative decoding of binary block and convolutional codes" published in *IEEE Trans. on Information Theory*, vol. 42, No. 2, March 1996, pages 429-445.

Diagrammatically, the iterative decoding algorithms carry out several elementary decoding steps on a data block, wherein each step uses an item of input information called a priori which generates, from the knowledge of the coding law, an item of output information called a posteriori, that is more reliable than the item of input information. The additional item of information with respect to the input information is called extrinsic information. This item of extrinsic information is taken into account to generate the a priori information in the next step. Each elementary decoding step thus benefits from an a priori information of improved reliability with respect to the previous step.

In principle, the iterative decoding method converges after a certain number of iterations. The criterion for interrupting the iterations has been the subject matter of a lot of research. In fact it is important, especially for mobile telephony, where the resources of the receiver are limited, to reduce as much as possible the number of iterations carried out, and consequently both the energy consumed and the latency time.

One trivial solution consists of fixing a predetermined number of iterations. However, this number may prove to be insufficient for transmission conditions with a low signal to noise ratio, in which case the error rates at the output of the decoder become abnormally high, or on the contrary excessive, in which case a certain number of iterations are carried out in pure loss.

Most of the interruption criteria proposed in the literature are based on the monitoring of the items of a priori information progressively during the successive iterations. Certain criteria measure the degree of reliability of the result of the output decoding of each iteration while others measure their progress. It may be understood that the growth in absolute value of a flexible value of a priori information, when expressed in the form of a probability ratio logarithm, is significant of the degree of convergence of the decoding method.

The known interruption criteria include that of the entropic difference between items of a posteriori information from two successive iterations, as described in the above article, as well as its derivatives, such as those described for example in the article by R. Y. Shao et al. entitled "Two simple stopping criteria for turbo decoding" published in *IEEE Transactions on Communications*, vol. 47, pages 117-120, August 1999, or even those based on the statistical properties of the extrinsic values, such as those described in the patent applications EP-A-1334562 and EP-A-1128589. The article by A. Matache et al. entitled "Stopping rules for turbo decoders" issued in 2000 in TMO Progress report 42-142, Jet Propulsion Laboratory, reviewed a certain number of interruption criteria using the hard values or the soft values of a posteriori information.

The interruption criteria mentioned above are designed for an additive Gaussian white noise channel, also called AWGN channel. In practice, however, the transmission channels of the wireless telecommunication systems, whether they be multi-carrier signal type systems such as IEEE 802.11a, IEEE 802.11g or frequency hop systems such as the GSM or EDGE (Enhanced Data GSM Environment) systems or even spread spectrum systems such as the UMTS system, may not be modelled by an AWGN channel but by a block fading channel.

Furthermore, the interruption criteria only apply during the iterative decoding. At present, there is no criterion permitting to determine in advance if the iterative decoding could converge or not.

Even in the absence of any iterative decoding, a receiver of a telecommunication system conventionally carries out the decoding of the error correction code applied during transmission, whether it is a code by blocks, a convolutional code or a concatenated code. When the transmission conditions are poor, it is possible that the decoding method may not be able to correct all of the errors affecting the block received. In this case, the receiver generally sends an automatic retransmission request or ARQ (Automatic Repeat reQuest) to the emitter. However, the decoding of the erroneous word will thus have burdened uselessly the resources of the receiver, both in terms of energy consumed and in latency time.

The objective of this invention is to permit the receiver to decide beforehand if it is useful to decode the code received, in particular iterative decoding, in order to avoid burdening its resources needlessly.

DESCRIPTION OF THE INVENTION

This invention is defined by a wireless telecommunication system, comprising a demodulator adapted to demodulate a signal received from a source via a transmission channel to provide an error correction code word in the form of flexible or hard values, a decoder adapted to decode said code word, wherein the receiver further comprises decision means adapted to receive an estimation of the fading coefficients of said channel during the transmission of said code word as well as an estimation of the noise variance or the signal to noise ratio, to deduce therefrom an estimation of the instantaneous mutual information relative to said channel, and to decide whether or not to inhibit the decoding of the code word by the decoder, according to whether the binary rate of transmission of the source is respectively greater than or less than a characteristic threshold of said instantaneous mutual information.

The instantaneous mutual information is advantageously estimated as the mean mutual information between the input and the output of said channel during the duration of the transmission of the code word.

According to one first variant, wherein the channel is of the type with an emitting antenna and a receiving antenna, the instantaneous mutual information is calculated according to:

$$I_{inst} = \frac{1}{n_c} \sum_{i=1}^{n_c} I_i$$

$$I_i = \log Q - \frac{1}{Q} \sum_{k=1}^{Q} E_z \left\{ \log \left( \sum_{q=1}^{Q} \exp\left[-\frac{|h_i a_k + z - h_i a_q|^2 - |z|^2}{2\sigma^2}\right] \right) \right\}$$

where $n_c$ is the number of fading coefficients $h_i$; $i=1, \ldots, n_c$ of the channel affecting the code word, $Q$ and $a_k$; $k=1, \ldots Q$ are respectively the cardinal number and the elements of the binary modulation symbol alphabet used to modulate the code word prior to its transmission on said channel, $\sigma^2$ is the variance of the noise affecting the channel, $z$ is a sample of noise according to a law $N(0,\sigma^2)$ and $E_z$ is the expectation for $z$.

According to a second variant, wherein the channel is of the type with an emitting antenna and a receiving antenna, the instantaneous mutual information of the channel is estimated from:

$$C_{inst} = \frac{\gamma}{n_c} \sum_{i=1}^{n_c} |h_i|^2$$

where $n_c$ is the number of fading coefficients $h_i$; $i=1, \ldots, n_c$ of the channel affecting the code word and $\gamma$ is the signal to noise ratio at the reception.

Preferably, said threshold value is equal to the instantaneous mutual information of the channel reduced by a strictly positive offset value.

The offset value may depend on at least one parameter belonging to the group formed by the level of charge of the battery of the receiver, the type of coding of said code word, the maximum latency time, the type of modulation and/or the cardinal number of the modulation alphabet used to modulate said code word prior to its transmission over the channel.

Furthermore, if the lifetime of a packet containing said code word has expired, the decoding may also be inhibited.

Advantageously, the decoder carries out iterative decoding and may be adapted to interrupt the decoding iterations based on the entropic difference of the items of a priori information supplied by two successive iterations or, alternatively, based on a reliability measurement of the a priori information.

BRIEF DESCRIPTION OF THE DRAWINGS

Other characteristics and advantages of the invention will become clearer upon reading a preferred embodiment of the invention made in reference to the attached figures among which:

FIG. 1 shows a code word to be transmitted on a block fading transmission channel;

FIG. 2 diagrammatically shows a receiver of a wireless telecommunication system, according to one embodiment of the invention.

DETAILED DESCRIPTION OF SPECIFIC EMBODIMENTS

The case of a wireless telecommunication system will be considered first, for example a radio-mobile telecommunication system, with a SISO configuration (Single Input Single Output), i.e. having a single emitting antenna and a single receiving antenna. The transmission channel may therefore be modelled as follows:

$$y_i = h_i x_i + z_i, i=1, \ldots, N \tag{1}$$

where $x_i$ and $y_i$ respectively represent the signals transmitted and received at the instant $t_i = iT$ where $T$ is the symbol period and $N$ is the number of symbols in the block, $z_i$ is a AWGN noise sample with a zero mean and a variance of $\sigma^2$ and the fading coefficients $h_i$ are samples of random variables that are independent and identically distributed (i.i.d.), typically according to a law of Rayleigh.

It is known that the capacity of a channel as defined by Shannon is the maximum of the mean mutual information $I(X,Y)$, wherein $X$ and $Y$ are random variables respectively associated to the input and the output of the channel. By mean mutual information, it is meant an item of mutual information averaged over the possible values $x$ of the input random variable $X$ and the possible values $y$ of the output random variable $Y$.

For a channel with no memory, which is to say for a channel whose output at a given instant depends solely on the input at this instant and not on the previous inputs and outputs, the capacity is defined as the maximum of the mean mutual information over all of the possible distributions $p_X$ of the input variable $X$, which is to say:

$$C = \max_{p_X, P \leq P_T} I(X, Y) \tag{2}$$

where $P = E\{|x^2|\}$ is the mean power of the input signal and $P_T$ is the maximum power of the emitter.

It should be remembered that the mean mutual information of a pair of random variables $X,Y$ is defined in the continuous case by:

$$I(X, Y) = \int \int p_{X,Y}(x, y) \log \frac{p_{X,Y}(x, y)}{p_X(x) p_Y(y)} dx dy \tag{3}$$

where $p_{X,Y}(x,y)$ is the density of the joint probability of $X$ and $Y$ and $p_X(x)$, wherein $p_Y(y)$ are the probability densities of $X$ and $Y$ respectively.

Firstly, it is supposed that the channel is ergodic, which is to say that $h(iT)$ is a random process with discrete ergodic time. The ergodic capacity, or capacity in the Shannon sense, of the SISO channel modelled by (1) is expressed as follows:

$$C = E_H \left\{ \max_{p(x), P \leq P_T} (I(X, Y)) \right\} \tag{4}$$

where $E_H\{.\}$ indicates the expectation on the law of probability of the coefficients $h_i$.

It can be shown that the ergodic capacity of the fading channel can be expressed as follows:

$$C = E_H \{\log(1 + \gamma |h|^2)\} \tag{5}$$

where $\gamma$ is the signal to noise ratio (SNR) at the reception. The generic term h is used here due to the identity of the laws of probability of the coefficients $h_i$.

Similarly, it has been shown that a MIMO channel (Multiple Input Multiple Output) which is to say with a plurality of emitting antennae and a plurality of receiving antennae may be modelled by:

$$y_i = H_i x_i + z_i, i=1, \ldots, N \tag{6}$$

where in this case $x_i$ and $y_i$ are respectively the vectors of the signals emitted by the M emitting antennae, and received by the P receiving antennae, $H_i$ is the matrix of the coefficients of propagation between the emitting and receiving antennae, $z_i$ is a vector of AWGN noise samples and N is the number of times the channel is used. It is supposed that the coefficients of the matrices $H_i$ are samples of i.i.d. random variables.

The capacity of the MIMO channel is defined similarly to (2):

$$C = \max_{p_X, tr(R_{xx}) \leq P_T} I(X, Y) \quad (7)$$

where X and Y are respectively random input and output vectors of the channel and $R_{xx} = E(x\tilde{x})$ is the covariance matrix of the random vector X. It is supposed in the following description that the components of X are independent and therefore that $$R_{xx} = \frac{P_T}{M} I_M$$

where $P_T$ is the total power of the emitter.

It has been shown that the ergodic capacity of the MIMO fading channel is defined by, similarly to (5):

$$C = E_H \left\{ \log \left[ \det \left( I_P + \frac{\gamma}{M} H\tilde{H} \right) \right] \right\} \quad (8)$$

where $I_P$ is the matrix identity of size P×P, $$\gamma = \frac{P_T}{\sigma^2}$$

designates the signal to noise ratio and $\tilde{H}$ the conjugate transpose of the matrix H.

The invention is based on the observation that the channels encountered in radio-mobile telecommunication systems are generally not ergodic. The capacity as defined by Shannon is furthermore equal to zero and therefore does not permit this type of channel to be characterised. For this reason, the notion of outage probability is introduced, defined as the probability that the instantaneous mutual information is lower than the binary rate of transmission per use of the channel, referenced R, expressed in bits (or more precisely in Shannons) per use of the channel.

By instantaneous mutual information, it is meant the mean mutual information for one instance of the channel, wherein the mean is taken as in (3) on the samples of the random variables X, Y respectively at the input and output of the channel.

The outage probability depends on the signal to noise ratio $\gamma$ and the binary rate of transmission R which is to say:

$$P_{out}(\gamma, R) = Pr(I(X,Y) < R) \quad (9)$$

For example, for a corrective code $(n, k, d_{min})$ and a cardinal number modulation alphabet Q, the binary rate of transmission is equal to $$R = \frac{k}{n} \log Q.$$

It should be remembered that a code conventionally referenced $(n, k, d_{min})$ is a code of length n, of dimension k and of minimum distance $d_{min}$.

The outage probability may be viewed as the probability that the instantaneous mutual information of the channel is lower than the binary rate of transmission. If it is lower than this rate, it will not be possible to decode the code words without error and therefore of no use to carry out the decoding. Conversely, by making a parallel with Shannon's fundamental theorem, if the instantaneous mutual information of the source is higher than this rate, it will always be possible to use a corrective code permitting the data to be transmitted with an arbitrarily low probability of error.

Whereas the ergodic capacity of a channel shows the largest quantity of information that it is capable of transferring on average (where the average is taken over the instances of the channel), the instantaneous mutual information shows the quantity of information that it is capable of transferring for a determined instance of the channel. The instantaneous mutual information is a function of the fading coefficients of the instance of the channel and the signal to noise ratio.

Now the case of a block fading transmission channel will be considered. FIG. 1 shows a code word $(n, k, d_{min})$ prior to binary symbol modulation (e.g. BPSK) and transmission on the channel. The code word is diagrammatically divided into $n_c$ blocks of size $$N = \frac{n}{n_c},$$

designated by $F_1, \ldots, F_{n_c}$, wherein each block $F_i$ is affected by a fading coefficient $h_i$.

It is important to understand that the partition of the code word by blocks does not prejudge the manner in which the bits are transmitted. Consequently a block may correspond to a set of contiguous carriers of an OFDM symbol or to a time interval: in the first case, the channel response is constant by spectral bands, in the second by time intervals. A block may also be defined jointly by a spectral band and a time interval.

A block fading channel is sometimes called non-ergodic or quasi-static, as a code word only sees a finite number ($n_c$) of fading coefficients. These coefficients may be considered as the result of $n_c$ uses of a random variable, for example with a Rayleigh distribution law. h designates the vector of the coefficients $h_i$, $i = 1, \ldots, n_c$.

The error rate for a packet (PER) of $\ell$ decoded bits may be written as follows:

$$PER = \int_h p(h)(1 - (1 - P_e(h))^\ell) \, dh \quad (10)$$

where the sum is calculated on the space of the fading coefficients, where $P_e(h)$ is the probability of error per bit knowing h, p(h) is the probability density of h and dh the elementary volume of space of the fading coefficients.

For a high value of $\ell$, $1 - (1 - P_e(h))^\ell$ may be increased by $\min(1, \ell P_e(h))$, as shown in the article by E. Malkamaki et al. entitled "Evaluating the performance of convolutional codes over block fading channel" published in IEEE Trans. on Information Theory, vol. 43, pp. 359-378, May 1994. The PER may then be increased as follows:

$$PER \leq \int_h \min(1, lP_e(h))p(h)dh \quad (11)$$

Outage region $R_{out}(\gamma,R)$ is used to define the set of points of $\mathfrak{R}^{+^{nc}}$ where $\mathfrak{R}^{+^{nc}}$ is the set of positive reals, such that:

$$\forall h \in R_{out}(\gamma,R), I(X,Y) < R \quad (12)$$

According to the definition of the outage region, it is known that if $h \in R_{out}(\gamma,R)$, the instantaneous creation of the channel does not permit error free decoding, which can be expressed by $$P_e(h) \geq \frac{1}{l}.$$

The upper limit of the expression (14) may then be broken down into two terms, as follows:

$$PER \leq \int_{h \in R_{out}} p(h)dh + \int_{h \notin R_{out}} lP_e(\gamma,h)p(h)dh \quad (13)$$

The first term is a component of the packet error rate which depends on the instance of the channel. The second term is a component of the packet error rate which depends on the level of noise when the instantaneous mutual information is higher than the binary rate of transmission R.

The instantaneous mutual information of the channel, which is to say, more precisely in this case, calculated on the duration of transmission of the code word, may be evaluated by:

$$I_{inst} = \frac{1}{n_c} \sum_{i=1}^{n_c} I_i \quad (14)$$

where $I_i$ is the instantaneous mutual information calculated on the block i. The behaviour of the channel on a block may be considered, disregarding the multiplying coefficient $h_i$, as being of the AWGN type.

It is supposed that the receiver knows the coefficients $h_i$ by means of the pilot symbol detection and that the Q-ary symbol to bits demodulator provides an estimation of the noise variance $\sigma^2$. It is therefore possible to express the mean mutual information $I_i$ of the SISO channel:

$$I_i = \log Q - \frac{1}{Q} \sum_{k=1}^{Q} E_z \left\{ \log \left( \sum_{q=1}^{Q} \exp \left[ -\frac{|h_i a_k + z - h_i a_q|^2 - |z|^2}{2\sigma^2} \right] \right) \right\} \quad (14')$$

where $a_q = 1, \ldots, Q$ are the symbols of the modulation alphabet and $z = N(0, \sigma^2)$.

Instead of estimating the instantaneous mutual information of the channel from (14) and (14'), it is possible to make an approximate evaluation empirically using:

$$I_{inst} \approx \frac{\gamma}{n_c} \sum_{i=1}^{n_c} |h_i|^2 \quad (15)$$

Now a SISO channel with OFDM modulation will be considered. If it is supposed that a code word is modulated on a single OFDM symbol, it can be shown that the instantaneous mutual information can be estimated by:

$$I_{inst} = \frac{1}{K} \log \left[ \det \left( I_K + \frac{1}{\sigma^2} H \Sigma \tilde{H} \right) \right] \quad (16)$$

where K is the number of carrier signals of the OFDM symbol (by hypothesis K=n), $I_K$ is the unit matrix of size K×K, $\Sigma$ is the covariance matrix of the input vector, i.e. the vector of the alphabet symbols, modulating the different carrier signals, $$H = \text{diag}\left\{h(e^{j2\pi \frac{k}{K}})\right\}_{k=0}^{K-1}$$

which is to say H is the diagonal matrix whose elements are the fading coefficients of the different carrier signals and $\tilde{H}$ is the conjugated transpose of H.

This result may be generalised to a MIMO channel with OFDM modulation, considering M concatenated OFDM symbols as an input vector, where M is, as shown above, the number of emitting antennae:

$$I_{inst} = \frac{1}{K} \log \left[ \det \left( I_{KP} + \frac{1}{\sigma^2} H_\mu \sum_\mu \tilde{H}_\mu \right) \right] \quad (17)$$

where K is the number of carrier signals of the OFDM symbol, P is the number of receiving antennae, $I_{KP}$ is the matrix unit of size KP×KP, $H_\mu$ is a block diagonal matrix of size KP×KM, wherein each of the K blocks is formed by a matrix of size P×M providing the fading coefficients between the emitting antennae and the propagation antennae at the frequency of a carrier signal, and $\Sigma_\mu$ is the covariance matrix of the input signals, of size KM×KM.

FIG. 2 diagrammatically shows a receiver according to one embodiment of the invention. The receiver comprises a symbol demodulator 210 which demodulates the input signal to supply the symbols received, a channel estimator 220 which estimates the coefficients $h_i$ based on the pilot symbols $SP_i$ sent by the emitter. The information symbols received S are then demodulated by the demodulator 230 supplying the code words c in the form of soft values. It should be noted that, if the modulation is of the BPSK type, the BPSK symbols provide the soft values directly. The code words thus obtained are then transmitted to a decoder 240, for example an iterative decoder in the case of a turbo-decoder or a message passing decoder. Alternatively, the demodulator 230 may supply hard values, in which case the decoder 240 is a classic ECC decoder (Error Correcting Code) that does not use reliability information.

The receiver further comprises decision means 250 receiving on the one hand, from the channel estimator 220, the estimations of the fading coefficients $h_i$ and on the other hand, from the demodulator 230, an estimation of the variance of the noise $\sigma^2$ and/or of the signal to noise ratio $\gamma$. The noise variance or the signal to noise ratio is calculated by the demodulator using the symbols received and the corresponding symbols free from noise. The latter are themselves obtained from hard decisions and estimations of the fading coefficients.

If the $\hat{x}_i$ designates the symbols decoded by hard decision, or the pilot symbols, and if $\hat{H}_i$ represents an estimation of the channel coefficients, the noise samples and therefore the noise variance can be determined, for example, from $\hat{z}_i = y_i - \hat{H}_i \hat{x}_i$, where $y_i$ are the received signals. In practice, it is possible to simply estimate the distance between the received signals, after equalisation, to the modulation constellation points and to derive there from the noise variance.

The signal to noise ratio can equally be obtained in a classical way as a function of the binary error rate (BER), for example by means of a look-up table storing the values BER=f(S/N).

The decision means 250 know the type of coding and modulation used or MCS (Modulation and Coding Scheme), either implicitly or by means of a message transmitted beforehand by the emitter. In particular, the receiver knows the symbols $a_q=1, \ldots, Q$ of the modulation alphabet.

These decision means calculate the instantaneous mutual information of the channel for example according to the expressions (14) and (14'), or (15) for a SISO channel, or according to the expression (16) for an OFDM SISO channel or even according to the expression (17) for an OFDM MIMO channel. Alternatively, the decision means may use a pre-calculated table stored in memory, indexed by the values of $h_i$, $\gamma$ and/or $\sigma^2$. The table may have been obtained by the calculation of an analytic expression such as (14) and (14'), 15, 16 or 17 or may even have been obtained by a simulation of the channel.

The decision means 250 compare the instantaneous mutual information of the channel thus estimated with the binary rate of transmission R. If the instantaneous mutual information of the channel is lower than the binary rate of transmission, the decision means 250 inhibit the decoding as it would not be capable of correcting all of the errors on the code word. Conversely, if the instantaneous mutual information of the channel is higher than the binary rate of transmission, the decision means 250 authorise the decoding as the correction of the errors is then possible. If the decoding is iterative, a criterion for interrupting the iterations, known as such, may then be applied.

When they inhibit the decoding, the decision means may simultaneously trigger the transmission of a non-acknowledgement message (NACK) to request the retransmission (ARQ) of the code word. Alternatively, the retransmission will occur at a higher level of protocol.

According to one variant of embodiment, the instantaneous mutual information of the channel, is not compared to R but to a reduced threshold, for example to R−δ, where δ>0 is a threshold offset that may depend on many parameters such as the battery level of the receiver, the type of coding, the maximum latency time, the type of modulation and in particular the cardinal number of the modulation alphabet Q. If $I_{inst}$<R−δ, the decoding is inhibited otherwise it is authorised.

For example, if the battery level is high or if the maximum latency time is high or even if Q is low, a low offset value may be chosen. Conversely, if the battery level is low or if the maximum latency time is low or if Q is high, a bigger margin will be used to authorise the decoding, in other words a higher offset value will be used.

According to another specific variant of embodiment, in the case where the instantaneous mutual information of the channel is such that $I_{inst} \geq R-\delta$, a further check is made if the lifetime of the packet containing the code word has expired and, if this is the case, the decoding is inhibited.

The invention claimed is:

1. Wireless telecommunication system receiver, comprising a demodulator adapted to demodulate a signal received from a source via a transmission channel to provide an error correction code word, hereinafter referred to as code word, in the form of soft or hard values, a decoder adapted to decode said code word, characterised in that it further comprises decision means adapted to receive an estimation of fading coefficients of said transmission channel during the transmission of said code word as well as an estimation of noise variance or of signal to noise ratio, to deduce therefrom an estimation of an instantaneous mutual information of said transmission channel, and to decide whether to decode the code word based on a comparison of a binary rate of transmission of the source and a threshold value based on said instantaneous mutual information.

2. Wireless telecommunication system receiver according to claim 1, characterised in that the instantaneous mutual information is estimated as a mean mutual information between input and output of said transmission channel during the duration of the transmission of the code word.

3. Wireless telecommunication system receiver according to claim 2, characterised in that, the transmission channel being of a type with one emitting antenna and one receiving antenna, the instantaneous mutual information is calculated according to:

$$I_{inst} = \frac{1}{n_c}\sum_{i=1}^{n_c} I_i$$

$$I_i = \log Q - \frac{1}{Q}\sum_{k=1}^{Q} E_z\left\{\log\left(\sum_{q=1}^{Q} \exp\left[-\frac{|h_i a_k + z - h_i a_q|^2 - |z|^2}{2\sigma^2}\right]\right)\right\}$$

where $n_c$ is the number of fading coefficients $h_i$; $i=1,\ldots,n_c$ of the channel affecting the code word, Q and $a_k$; $k=1,\ldots Q$ are respectively the cardinal number and the elements of the binary modulation symbol alphabet used to modulate the code word prior to its transmission on said channel, $\sigma^2$ is the variance of the noise affecting the channel, z is a sample of noise according to a law $N(0,\sigma^2)$ and $E_z$ is the expectation for z.

4. Wireless telecommunication system receiver according to claim 1, characterised in that, as the channel is of a type with one emitting antenna and one receiving antenna, the instantaneous mutual information of the channel is estimated from:

$$C_{inst} = \frac{\gamma}{n_c}\sum_{i=1}^{n_c} |h_i|^2$$

where $n_c$ is the number of fading coefficients $h_i$; $i=1,\ldots,n_c$ of the channel affecting the code word and $\gamma$ is the signal to noise ratio at the reception.

5. Wireless telecommunication system receiver according to claim 1, characterised in that said threshold value is equal to the instantaneous mutual information of the transmission channel reduced by a strictly positive offset value.

6. Wireless telecommunication system receiver according to claim 5, characterised in that the strictly positive offset value is a function of at least one parameter belonging to a group formed by a level of charge of a battery of the wireless telecommunication system receiver, a type of coding of said code word, a maximum latency time, a type of modulation and the cardinal number of a modulation alphabet used to modulate said code word prior to its transmission on the transmission channel.

7. Wireless telecommunication system receiver according to claim 1, characterised in that if the lifetime of a packet containing said code word has expired, decoding is inhibited.

8. Wireless telecommunication system receiver according to claim 1, characterised in that the decoder carries out iterative decoding.

9. Wireless telecommunication system receiver according to claim 8, characterised in that the decoder is adapted to interrupt the decoding iterations based on an entropic difference between a priori information items supplied by two successive iterations.

10. Wireless telecommunication system receiver according to claim 8, characterised in that the decoder is adapted to interrupt the iterations of said decoder based on a reliability measurement of a priori information.

\* \* \* \* \*